United States Patent
Hackenberg et al.

(10) Patent No.: US 9,224,894 B2
(45) Date of Patent: Dec. 29, 2015

(54) DEVICE FOR THE HOMOGENEOUS WET-CHEMICAL TREATMENT OF SUBSTRATES

(71) Applicants: Juergen Hackenberg, Sachsenheim (DE); Michael Lingner, Vaihingen/Enz (DE); Harald Bauer, Ehningen (DE)

(72) Inventors: Juergen Hackenberg, Sachsenheim (DE); Michael Lingner, Vaihingen/Enz (DE); Harald Bauer, Ehningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/513,375

(22) Filed: Oct. 14, 2014

(65) Prior Publication Data

US 2015/0104897 A1 Apr. 16, 2015

(30) Foreign Application Priority Data

Oct. 15, 2013 (DE) .......................... 10 2013 220 810

(51) Int. Cl.
*H01L 31/0236* (2006.01)
*B05C 3/04* (2006.01)
*B05C 3/02* (2006.01)

(52) U.S. Cl.
CPC ............ *H01L 31/02366* (2013.01); *B05C 3/02* (2013.01); *B05C 3/04* (2013.01)

(58) Field of Classification Search
USPC ........................................................... 438/71
See application file for complete search history.

(56) References Cited

U.S. PATENT DOCUMENTS

| 8,635,969 B2* | 1/2014 | Challaye ................. C23C 2/003 118/400 |
| 8,656,858 B2* | 2/2014 | Schneider ........... C23C 18/1601 118/412 |
| 8,683,942 B2* | 4/2014 | Wu .......................... C23C 18/12 118/423 |
| 2014/0251420 A1* | 9/2014 | Chen ............... H01L 31/022466 136/256 |
| 2015/0093906 A1* | 4/2015 | Kobayashi ........ H01L 21/31111 438/748 |

FOREIGN PATENT DOCUMENTS

DE 10 2005 025 123 12/2006

* cited by examiner

*Primary Examiner* — Asok K Sarkar
(74) *Attorney, Agent, or Firm* — Kenyon & Kenyon LLP

(57) ABSTRACT

A device for wet-chemical treatment of substrates includes: an accommodation device for a substrate and a process medium, the substrate having a treatment side in operative connection with the process medium; a fluid guidance element, having a specified surface texture, housed in the accommodation device, the specified surface texture being configured to provide a guidance of the process medium along the specified surface texture, the specified surface texture being positioned lying opposite and at a predetermined fixed recess at a distance from the treatment side of the substrate; and the process medium being moved in the intervening space between the specified surface texture of the fluid guidance element and the treatment side of the substrate.

9 Claims, 2 Drawing Sheets

DEVICE FOR THE HOMOGENEOUS WET-CHEMICAL TREATMENT OF SUBSTRATES

BACKGROUND OF THE INVENTION

1. Field of the Invention

The present invention relates to a device for the wet-chemical treatment of substrates, particularly of solar cells, including at least one accommodation device, at least one substrate and at least one process medium being able to be inserted, or having been inserted into the at least one accommodation device; the at least one substrate having at least one treatment side which is able to be brought into, or is in operative connection with the process medium.

2. Description of the Related Art

For the production of solar cells, substrates are coated with various metal layers and semiconductor layers as well as buffer layers, by vapor-depositing, sputtering, by Galvanic deposition or by chemical bath deposition.

In particular, in the case of Cu(In,Ga)(S,Se)2-solar cells (CIGS solar cells), for the depositing of n-semiconductors, so-called buffer layers, a wet-chemical method is used, designated in English also by the term chemical bath deposition (CBD). In this context, the buffer layer includes cadmium sulfide (CdS), for example, undoped zinc oxide (ZnO), indium(III) sulfide ($In_2S_3$), and/or (Zn,Mg)O.

The coating with a buffer layer takes place, in the related art, in a precipitation reaction, in which various reaction mechanisms, which partially oppose one another, run at the same time. In order to obtain the desired reaction, concentration, temperature and flow speed have to be kept within tight limits.

In the production of buffer layers, the challenge is that, particularly in the CdS precipitation, that undesired colloids created in a secondary reaction do not get to the surface of the substrate to be coated.

It is therefore known in the related art that one should keep the process medium used in motion. For instance, published German patent application document DE 10 2005 025 123 A1 describes that thin-film chalcopyrite-(CIS) solar cells are inserted into an etching solution in a lying position or hanging in a sample holder and exposed for a certain time to the etching solution. In that process, the solution should be able to be stirred manually, by a magnetic stirrer or by ultrasound.

In the related art, it is known alternatively that the substrates are moved over the process medium, so that colloids being created and other undesired particles settle downwards. In this context, it should be noted that, in applying buffer layers, the flow speed of the process medium has to be held within tight limits. Therefore, in order to generate a fluid motion relative to the substrate, according to the related art, the substrate is guided at a certain inclination through the process medium, and a system of rollers situated transversely to the substrate is situated barely above the substrate that is to be coated. The process medium is distributed by the rollers transversely over the substrate and put in motion, and it runs in a planar manner over the substrate until the next roller. There, it is distributed transversely again and mixed together. However, this has the disadvantage that, to be sure, between the rollers an only slightly changed flow speed is able to be provided, but in the area of the rollers, a change in the flow speed does occur. In addition, the rollers have to be situated very tightly over the substrate, so that, in the case of thin substrates, the flow conditions change by the bending of the latter.

It would therefore be desirable to be able to resort to devices which are not afflicted by the disadvantages of the related art, and which would particularly enable the reliable coating of substrates, particularly with buffer layers.

BRIEF SUMMARY OF THE INVENTION

This object is attained in that in the device at least one fluid guidance element, having a specified surface texture, is included by the at least one accommodation device, the at least one specified surface texture of the at least one fluid guidance element being designed and set up in order to provide a guidance of the process medium along the specified surface texture, and the at least one specified surface texture is able to be positioned, or is positioned lying opposite and at a predetermined fixed recess at a distance from the at least one substrate; and the process medium being movable, or being moved in the intervening space between the specified surface texture of the at least one fluid guidance element and the at least one treatment side of the at least one substrate, using a flow generating device and/or the at least one treatment side of the at least one substrate being movable, or being moved along the specified surface texture of the at least one fluid guidance element and/or the specified surface texture of the at least one fluid guidance element being movable, or being moved along the at least one treatment side of the at least one substrate.

The flow of a process medium along a treatment side of a substrate is able to be affected by the specified surface texture of the at least one fluid guidance element according to the present invention. By a suitable choice of the specified surface texture, a homogeneous flow of the process medium may particularly be achieved.

In the following, by the term process medium one should understand all the deposition design approaches known to one skilled in the art, for instance, an aqueous alkaline adsorbent solution which contains at least one salt of a metal from the group Cd, In, Mg, Sn and Zn having a concentration in the range of 1 to 500 mmol/l, or an aqueous solution of a sulfur-donating substance having a concentration in the range of 30 to 2500 mmol/l, particularly 200 to 1500 mmol/l. The solutions mentioned as examples are obviously to be understood to be exclusively exemplary, in this context. It is clear to one skilled in the art that the device, according to the present invention, is not restricted to the process media named.

In this context, according to the present invention, the specified surface texture of the at least one fluid guidance element is situated opposite, and at a distance from the treatment side of the substrate, in order to provide a defined flow channel of the process medium between the treatment side and the specified surface texture.

For the generation of the desired flow, the process medium itself may be moved using a flow generating device, such as a nozzle. Alternatively or in addition, the treatment side of the substrate may be guided past the specified surface texture in the process medium, and consequently, a possibly additional flow is able to be provided. Alternatively or in addition, it may of course also be provided that the specified surface texture be moved in the process medium, and thereby a specified, possibly additional flow may, in turn, be generated along the treatment side of the substrate.

In this context, it is obvious to one skilled in the art that the specified distance between the specified surface texture and the treatment side may be almost freely selectable, for instance, as a function of the measurements of the substrate, of the desired flow speed of the process medium, of the selected process medium and/or of the selected specified surface texture. Distances between 1 and 50 mm, particularly between 1 and 10 mm are especially suitable in this context.

Using the device according to the present invention thus makes possible that, in currentless coating methods, the minimum flow required against the treatment side of a substrate is able to be provided in an homogeneous manner. Because of the homogeneous flow of the process medium, it may particularly be avoided that the colloids or other undesired particles settle in local dead zones of the flow. In the device according to the present invention, colloids and other undesired particles, comparably to the working principle of a cross flow filter, additionally experience a buoyancy force away from the treatment side. As it were, the device according to the present invention has the effect that the retention time of the process medium until the next cleaning of the device and the process medium and/or a necessary exchange of the process medium is significantly prolonged.

The device according to the present invention also makes possible that the accommodation region is able to be selected to have a low volume and/or that, in an exclusive manner, a small quantity of process solution is required, compared to devices known from the related art. Because of the missing dead zones in the flow and the buoyancy provided, a relatively large proportion of colloids and other undesired particles may be present in the process medium, without the quality of the deposition being impaired, and they settle out on the treatment side of the substrate.

Depending on the desired application case, the substrate itself is nearly freely selectable, for besides a rigid substrate such as glass or aluminum, a polyamide substrate is conceivable. It is clear in this connection, to one skilled in the art, that the device, according to the present invention is not restricted to certain substrate. It is obvious to one skilled in the art that material may be coated coming from a roll, such as metal foil, glass and/or plastic foils. In particular, however, substrates may be included in, or provided by the invention, which are used in solar cells.

According to one specific embodiment of the present invention, it may be of advantage that the at least one accommodation device has at least one bottom element, at least two opposite side elements as well as an opening side that is opposite to the bottom element, the at least one fluid guidance element being particularly situated on the bottom element, and the specified surface texture of the at least one fluid guidance element being situated on the side opposite to the bottom element.

It may thus prove advantageous if the flow of the process medium is guided by providing a flow channel including the treatment side of the substrate and the side elements as well as the bottom element of the accommodation device. The designation side element and bottom element should presently be understood exclusively in exemplary fashion, and be used for the easier understanding of the device according to the present invention. The bottom element may, of course, also develop a side element, and it is likewise also conceivable that the treatment side of the substrate develops a side element, in which, for example, the substrate is introduced vertically, particularly in an hanging manner, into the accommodation region.

According to one specific embodiment of the present invention, it may be preferred that at least one moving device be included, which is designed and set up to move the at least one treatment side of the at least one substrate along the specified surface texture of the at least one fluid guidance element, the at least one moving device being developed particularly in the form of at least one vacuum cup and/or the at least one flow generating device being developed in the form of a magnetic stirrer, an ultrasonic generator, an oscillating or vibrating element, a propeller, a nozzle and/or a pump.

The use of a vacuum cup for holding and moving the substrate has particularly proven advantageous. In the same way, a flow generating device may be advantageous in the form of a magnetic stirrer, an ultrasonic generator, an oscillating or vibrating element, a propeller, a nozzle and/or a pump as a function of the selected substrate and the selected process solution.

According to one specific embodiment of the present invention, it may also be advantageous that the specified surface texture of the at least one fluid guidance element is developed in the form of a particularly regular, undulating, pimpled, perforated and/or stiffened surface texture, a ball bed and/or an expanded metal plate.

These surface textures have all proven to be advantageous for providing a desired flow of the process medium.

It may particularly be preferred that the at least one treatment side of the at least one substrate is able to be inserted, or is introduced into the at least one process medium, the side of the at least one substrate that is opposite to the treatment side, and particularly the side edges of the at least one substrate not being able to be inserted or being inserted into the at least one process medium.

In this context, it may be preferred that, using a sealing device, the side opposite the treatment side of the at least one substrate, and particularly the side edges of the at least one substrate, with respect to which at least one process medium is sealable, or is sealed, in particular, the sealing device in the form of a centrifugal pump, particularly of a centrifugal pump in the form of a propeller or a fan being provided, whose pressure side, at least in regions, is able to be situated, or is situated, particularly perpendicularly, above the opening side of the at least one accommodation region.

The device, according to the present invention, thus makes possible that only one side of the substrate is able to be brought into, or is in operative connection with the process medium. In this case, the upper side of the accommodation region is able to be sealed by the substrate itself. Consequently, a targeted coating is able to be provided of only one side of a substrate at simultaneous sealing of the accommodation region.

By sealing one may understand both a complete and also a partial sealing of the accommodation region.

In the case of the coating of substrates with CdS as buffer layer, for example, there is the problem that this coating is toxic. The sealing provided is therefore of advantage. In addition, in particular, a centrifugal pump according to the present invention is able to lead, by simple means, to avoiding the exit of toxic vapors and, at the same time, to protecting the side edges and the side of the substrate opposite the treatment side from contact with the process medium.

It may also be provided, according to the present invention, that at least one of the side elements of the at least one accommodation region is developed to be U-shaped, the U-shaped side element being situated, in regions, over the at least one substrate, and a suctioning device being able to be situated, or being situated within the U-shaped side element.

This has the advantage, especially in the case of toxic process media, that the outflow of toxic vapors is able to be prevented.

According to one specific embodiment of the present invention, it may particularly be provided that at least two accommodation regions are included, the at least one substrate being able to be moved from one accommodation region to a further accommodation region, particularly using the at least one direction of motion.

By a cascade-like arrangement of at least two accommodation regions, small treatment zones of the substrate are able to be provided having one or more process media, the accommodation regions each having only a low volume. Therefore, when transferring a substrate from one accommodation region to another accommodation region, one may have to discard only a small quantity of process medium. A great variability of different treatment zones can be enabled by a suitable arrangement of the accommodation.

The present invention also supplies a method for the wet-chemical treatment of substances in a device according to the present invention including the following steps, especially in this sequence:
 a) inserting a process medium into the at least one accommodation region
 b) inserting the treatment side of the at least one substrate into the process medium
 c) moving the process medium in the intervening space between the specified surface texture of the at least one fluid guidance element and the treatment side of the substrate using the flow generating device and/or moving the treatment side of the substrate along the specified surface texture of the at least one fluid guidance element and/or moving the specific embodiment of the at least one fluid guidance element along the treatment side of the substrate.

Finally, the present invention also supplies a use of a device, according to the present invention, for the wet-chemical deposition of a buffer layer of a solar cell, particularly of a Cu(In,Ga)(S,Se)2-solar cell, especially of cadmium sulfide (CdS), undoped zinc oxide (ZnO), indium(111)-sulfide ($In_2S_3$), and/or (Zn,Mg)O.

DETAILED DESCRIPTION OF THE INVENTION

Figure 1:
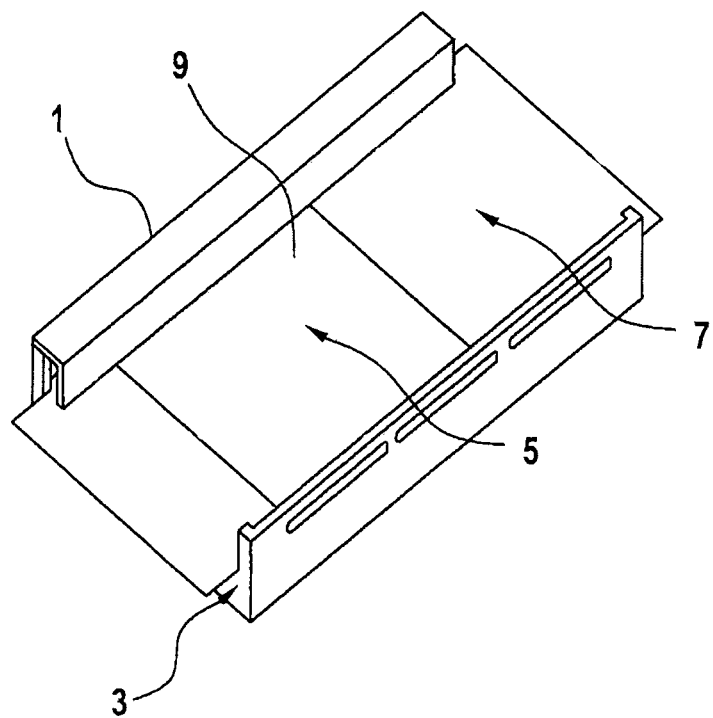
FIG. 1 is a perspective illustration of one specific embodiment of a device according to the present invention.

FIG. 1 shows a specific embodiment of a device 1, according to the present invention, for the wet-chemical treatment of substrates, particularly of solar cells. Device 1 includes an accommodation device 3 in which a substrate 5 and a process medium 7 are inserted. Substrate 5 has a treatment side (not shown), which is in operative connection with process medium 7, and has a side 9 opposite to the treatment side.

Figure 2:
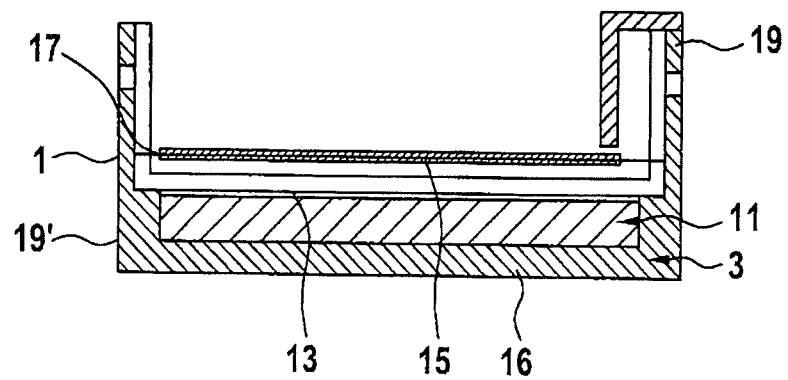
FIG. 2 is a side view of the specific embodiment according to FIG. 1 in section.
Figure 3:
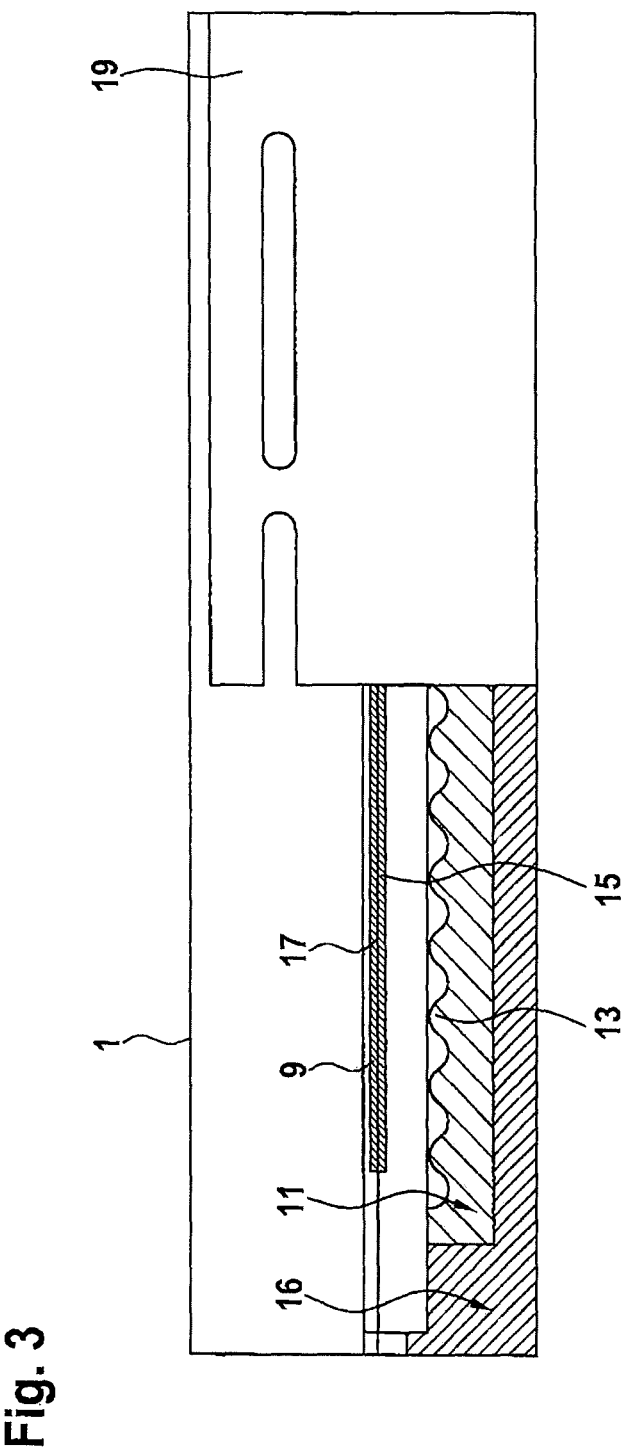
FIG. 3 is an additional side view of the specific embodiment according to FIG. 1 in section.

A fluid guidance element 11 having a specified surface texture 13 is shown on a bottom element 16 in FIGS. 2 and 3. Fluid guidance element 11 is designed and set up to provide a guidance of process medium 7 along the specified surface texture 13. In this context, specified surface texture 13 is situated opposite and at a distance of a predetermined fixed recess from the at least one treatment side 15 of the at least one substrate 5.

Process medium 7 is able to be moved in the intervening space between specified surface texture 13 of fluid guidance element 11 and treatment side 15 of substrate 5, using a flow generating device that is not shown. Alternatively or in addition, substrate 5 is able to be moved, using a moving device (not shown), relative to the specified surface texture 13 or the specified surface texture 13 is able to be moved relative to substrate 5 in order to generate a flow of the process medium along specified surface texture 13 and treatment side 15 of substrate 5.

In addition, FIGS. 2 and 3 show that treatment side 15 of substrate 5 is inserted in process medium 7, side 9, opposite to treatment side 15, of the at least one substrate 5, and particularly side edges 17 of substrate 5, are not inserted in process medium 7.

Using a sealing device (not shown), side 9, lying opposite treatment side 15 of substrate 5, and particularly edges 17 of substrate 5 are sealed from process medium 7. The sealing device (not shown) may be provided, in this instance, for example, in the form of a centrifugal pump, particularly of a centrifugal pump in the form of a propeller or a fan, whose pressure side is situated, at least in regions, especially perpendicular over the opening side of the at least one accommodation region 3.

A side element 19 is developed U-shaped, the U-shaped side element 19 being situated in regions over substrate 5, and within U-shaped side element 19 a suctioning device being situated that is not shown.

Consequently, using a centrifugal pump not shown, an overpressure may be generated in the region of side 9 of substrate 5, that is not to be treated, so that it does not come into contact with process medium 7. In addition, the fluid used to generate the overpressure, such as air, may be suctioned off, using the suctioning device not shown, in the region of U-shaped side element 19.

What is claimed is:

1. A device for wet-chemical treatment of a substrate, comprising:
 at least one accommodation device into which at least one substrate and at least one process medium are inserted, the at least one substrate having at least one treatment side in operative connection with the process medium;
 wherein at least one fluid guidance element having a specified surface texture is included in the at least one accommodation device, the at least one specified surface texture of the at least one fluid guidance element being configured to provide a guidance of the process medium along the specified surface texture, and the at least one specified surface texture being situated opposite to, and distanced at a predetermined fixed recess from the at least one treatment side of the at least one substrate; and
 wherein the process medium is moved in the intervening space between the specified surface texture of the at least one fluid guidance element and the at least one treatment side of the at least one substrate by at least one of: (i) using a flow generating device, (ii) the at least one treatment side of the at least one substrate being moved along the specified surface texture of the at least one fluid guidance element, and (iii) the specified surface texture of the at least one fluid guidance element being moved along the at least one treatment side of the at least one substrate.

2. The device as recited in claim 1, wherein the at least one accommodation device has at least one bottom element, at least two opposite side elements, and an opening side lying opposite to the bottom element, the at least one fluid guidance element being situated on the bottom element, and the specified surface texture of the at least one fluid guidance element being situated on the side opposite to the bottom element.

3. The device as recited in claim 2, further comprising:
 at least one moving device configure to move the at least one treatment side of the at least one substrate along the specified surface texture of the at least one fluid guidance element, wherein at least one of: (i) the at least one moving device is in the form of at least one vacuum cup; and (ii) the at least one flow generating device is in the form of at least one of a magnetic stirrer, an ultrasonic generator, an oscillating element, a vibrating element, a propeller, a nozzle and a pump.

4. The device as recited in claim 2, wherein the specified surface texture of the at least one fluid guidance element is in the form of at least one of an undulating, pimpled, perforated, and a ball bed surface texture.

5. The device as recited in claim 2, wherein the at least one treatment side of the at least one substrate is inserted into the at least one process medium, the side of the at least one substrate lying opposite the treatment side, and wherein the side edges of the at least one substrate are not inserted into the at least one process medium.

6. The device as recited in claim 5, wherein the side lying opposite the treatment side of the at least one substrate is sealed from the at least one process medium by a sealing device in the form of a centrifugal pump whose pressure side is situated, at least in regions, perpendicular over the opening side of the at least one accommodation region.

7. The device as recited in claim 2, wherein at least one of the side elements of the at least one accommodation region is U-shaped and situated, in regions, over the at least one substrate, and wherein a suctioning device is situated within the U-shaped side element.

8. The device as recited in claim 3, wherein at least two accommodation regions are included, the at least one substrate being moved from one accommodation region into a further accommodation region using the at least one moving device.

9. A method for wet-chemical treatment of a substrate in an accommodation device, comprising in the following sequence:
   a) inserting a process medium into the at least one accommodation device, wherein the accommodation device includes: at least one fluid guidance element having a specified surface texture configured to provide a guidance of the process medium along the specified surface texture;
   b) inserting a treatment side of the substrate into the process medium, wherein the specified surface texture of the fluid guidance element is situated opposite to, and distanced at a predetermined fixed recess from, the treatment side of the substrate; and
   c) moving the process medium in an intervening space between the specified surface texture of the at least one fluid guidance element and the treatment side of the substrate by at least one of (i) using the flow generating device, (ii) moving the treatment side of the substrate along the specified surface texture of the at least one fluid guidance element, and (iii) moving the specified surface texture of the at least one fluid guidance element along the treatment side of the substrate.

\* \* \* \* \*